United States Patent [19]
Oh

[11] Patent Number: 5,781,500
[45] Date of Patent: Jul. 14, 1998

[54] METHOD AND CIRCUIT FOR GENERATING INTERNAL PULSE SIGNALS IN SYNCHRONOUS MEMORY

[75] Inventor: Jong Hoon Oh, Kyoungki-do, Rep. of Korea

[73] Assignee: Hyundai Electronics Industries Co., Ltd., Kyoungki-do, Rep. of Korea

[21] Appl. No.: 850,247

[22] Filed: May 2, 1997

[30] Foreign Application Priority Data

May 6, 1996 [KR] Rep. of Korea .................. 199614688

[51] Int. Cl.$^6$ .................................................. G11C 8/00
[52] U.S. Cl. .................................. 365/233; 365/194
[58] Field of Search .............................. 365/233, 194, 365/193, 236

[56] References Cited

U.S. PATENT DOCUMENTS

| | | | |
|---|---|---|---|
| 4,984,216 | 1/1991 | Toda et al. | 365/230.08 |
| 5,392,239 | 2/1995 | Margulis et al. | 365/233 |
| 5,568,445 | 10/1996 | Park et al. | 365/233 |
| 5,598,376 | 1/1997 | Merritt et al. | 365/233 |
| 5,610,864 | 3/1997 | Manning | 365/193 |
| 5,610,874 | 3/1997 | Park et al. | 365/236 |
| 5,652,724 | 7/1997 | Manning | 365/189.05 |
| 5,673,233 | 9/1997 | Wright et al. | 365/233 |

*Primary Examiner*—Son T. Dinh
*Attorney, Agent, or Firm*—Merchant Gould Smith Edell Welter and Schmidt

[57] ABSTRACT

A method and a circuit for generating internal pulse signals in a synchronous memory is provided. A first pulse signal is generated in response to a burst mode command to transfer an external column address to an internal column address line. After the generation of the first pulse signal, a second pulse signal is generated to transfer an internal column address from an internal column address counter to the internal column address line in each clock cycle until the burst mode operation is advanced by a predetermined burst length. When a burst interrupt is generated in burst mode operation to perform the burst mode operation in response to a new external column address, the first pulse signal is generated and the generation of the second pulse signal is suppressed.

5 Claims, 8 Drawing Sheets

1

METHOD AND CIRCUIT FOR GENERATING INTERNAL PULSE SIGNALS IN SYNCHRONOUS MEMORY

BACKGROUND OF THE INVENTION

1. Field of the Invention

The present invention relates in general to a synchronous memory such as a synchronous dynamic random access memory (referred to hereinafter as SDRAM), and more particularly to a method and a circuit for generating internal pulse signals in the synchronous memory to prevent an external column address from colliding with an internal column address when a burst interrupt is generated in burst mode operation.

2. Description of the Prior Art

In a conventional synchronous memory, when a burst interrupt is generated in burst mode operation to perform the burst mode operation in response to a new external column address, the new external column address occasionally collides with an internal column address, or counter column address, on an internal column address line. In this case, the burst mode operation cannot perform normally.

SUMMARY OF THE INVENTION

The present invention has been made in view of the above problem, and it is an objective of the present invention to provide a method and a circuit for generating internal pulse signals in a synchronous memory to prevent an external column address from colliding with an internal column address when a burst interrupt is generated in burst mode operation.

In accordance with one aspect of the present invention, a method for generating internal pulse signals in a synchronous memory is provided and comprises the first step of generating a first pulse signal in response to a burst mode command to transfer an external column address to an internal column address line; the second step of generating a second pulse signal after the generation of the first pulse signal at the first step to transfer an internal column address from an internal column address counter to the internal column address line in each clock cycle until the burst mode operation is advanced by a predetermined burst length; and the third step of, when a burst interrupt is generated in burst mode operation to perform the burst mode operation in response to a new external column address, generating the first pulse signal and suppressing the generation of the second pulse signal.

In accordance with another aspect of the present invention, a circuit for generating internal pulse signals in a synchronous memory is provided and comprises edge signal generation means for generating an edge signal with a pulse width corresponding to a predetermined delay time from an input clock signal; first delay means for delaying a row address strobe bar signal and inverting the delayed signal; second delay means for delaying a column address strobe bar signal and inverting the delayed signal; third delay means for delaying a chip select signal and inverting the delayed signal; first external input buffer means for receiving the edge signal from the edge signal generation means at its strobe terminal and buffering the delayed signal and inverted signal from the first delay means in response to the received edge signal; second external input buffer means for receiving the edge signal from the edge signal generation means at its strobe terminal and buffering the delayed signal and inverted signal from the second delay means in response to the received edge signal; third external input buffer means for receiving the edge signal from the edge signal generation means at its strobe terminal and buffering the delayed signal and inverted signal from the third delay means in response to the received edge signal; first internal pulse signal generation means for logically combining output signals from the first to third external input buffer means and generating a first pulse signal in accordance with the logically combined result to transfer an external column address to an internal column address line in response to a burst mode command; flip-flop means for generating an active select signal indicative of a burst mode operation start time in response to the first pulse signal from the first internal pulse signal generation means and an inactive select signal in response to a pulse signal which is generated from a burst length sense circuit when a predetermined number of burst cycles are completed; second internal pulse signal generation means for generating a second pulse signal in response to the edge signal from the edge signal generation when the flip-flop means generates the active select signal, to transfer an internal column address from an internal column address counter to the internal column address line in each clock cycle, and blocking the edge signal from the edge signal generation means when the flip-flop means generates the inactive select signal or a burst interrupt signal is applied, to suppress the generation of the second pulse signal; and logic means for logically combining the first and second pulse signals from the first and second internal pulse signal generation means and generating a column enable signal in accordance with the logically combined result.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

FIGS. 1a to 1k are timing diagrams illustrating a burst mode operation of an SDRAM in accordance with the present invention. If a burst mode command (read or write) is applied at time T0 as shown in FIG. 1e, a burst mode operation (read or write) is successively performed in clock cycles beginning with the subsequent clock cycle, in response to successively increased column addresses from an internal column address counter in the chip. Such a burst mode operation is advanced by a burst length programmed in the chip.

A burst interrupt may be generated in burst mode operation to perform the burst mode operation in response to a new external column address (for example, Yb at time T2). In this case, the previous burst mode operation based on an external column address Ya is stopped and a new burst mode operation is started based on the external column address Yb.

Pulse signals ecasatv are generated as shown in FIG. 1f to transfer the external column addresses Ya and Yb to an internal column address line in the chip. Pulse signals icasatv are generated as shown in FIG. 1h to transfer internal column addresses Ya+1, Yb+1, Yb+2 . . . from the internal column address counter to the internal column address line.

In order to avoid the collision between the external and internal column addresses on the internal column address line, the following operation requirements must be satisfied at the time T2.

First, because the new burst mode operation starts at the time T2 in response to the external column address Yb, an internal column address Ya+2 for the previous burst mode operation must not be supplied from the internal column address counter and the external column address Yb must be placed on the internal column address line.

Second, at the time T2, the pulse signal ecasatv must be generated in response to the burst mode command. At this time, the pulse signal icasatv must not be generated.

Figure 1:
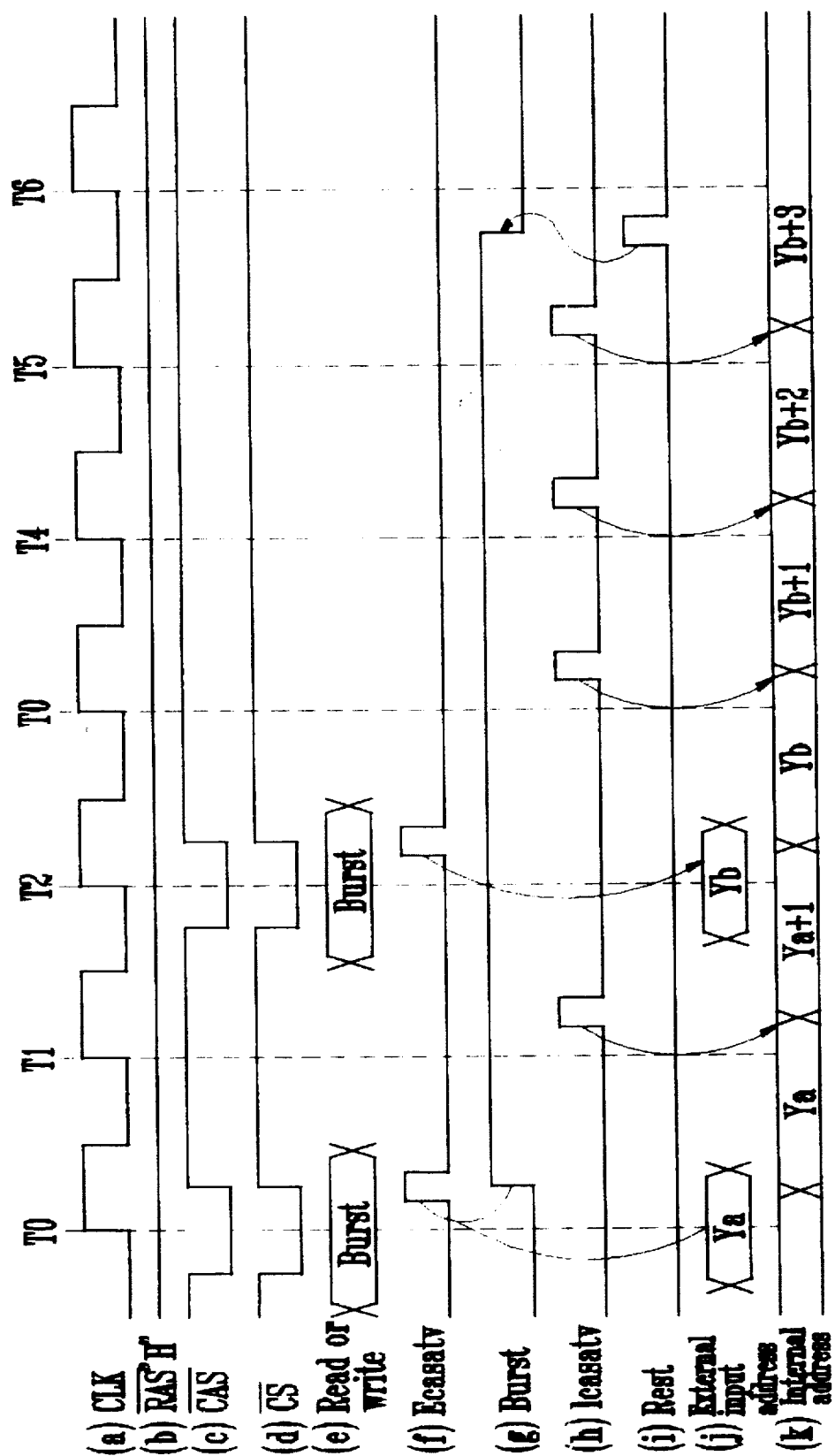
FIGS. 1a to 1k are timing diagrams illustrating a burst mode operation of an SDRAM in accordance with the present invention.

Namely, in order to satisfy the operation timing of FIG. 1, the pulse signal ecasatv as shown in FIG. 1f is generated in response to the burst mode command to transfer the external column address as shown in FIG. 1j to the internal column address line as shown in FIG. 1k in the corresponding clock cycle, so as to make a column cycle active. In the subsequent clock cycles, the pulse signals icasatv as shown in FIG. 1h are generated to transfer the internal column addresses from the internal column address counter to the internal column address line in the respective clock cycles. The pulse signals ecasatv and icasatv are generated in the same clock interval, and the internal column address counter generates the internal column addresses by counting the external column address. When a burst interrupt is generated in burst mode operation to perform the burst mode operation in response to a new external column address, the pulse signal ecasatv is generated and the pulse signal icasatv is suppressed in generation, so as to avoid the collision between the external and internal column addresses on the internal column address line. Therefore, the burst mode operation can be performed normally.

The preferred embodiments of the present invention for satisfying the operation timing of the SDRAM in FIG. 1 will be described in detail with reference to FIGS. 2 to 8.

Figure 2:
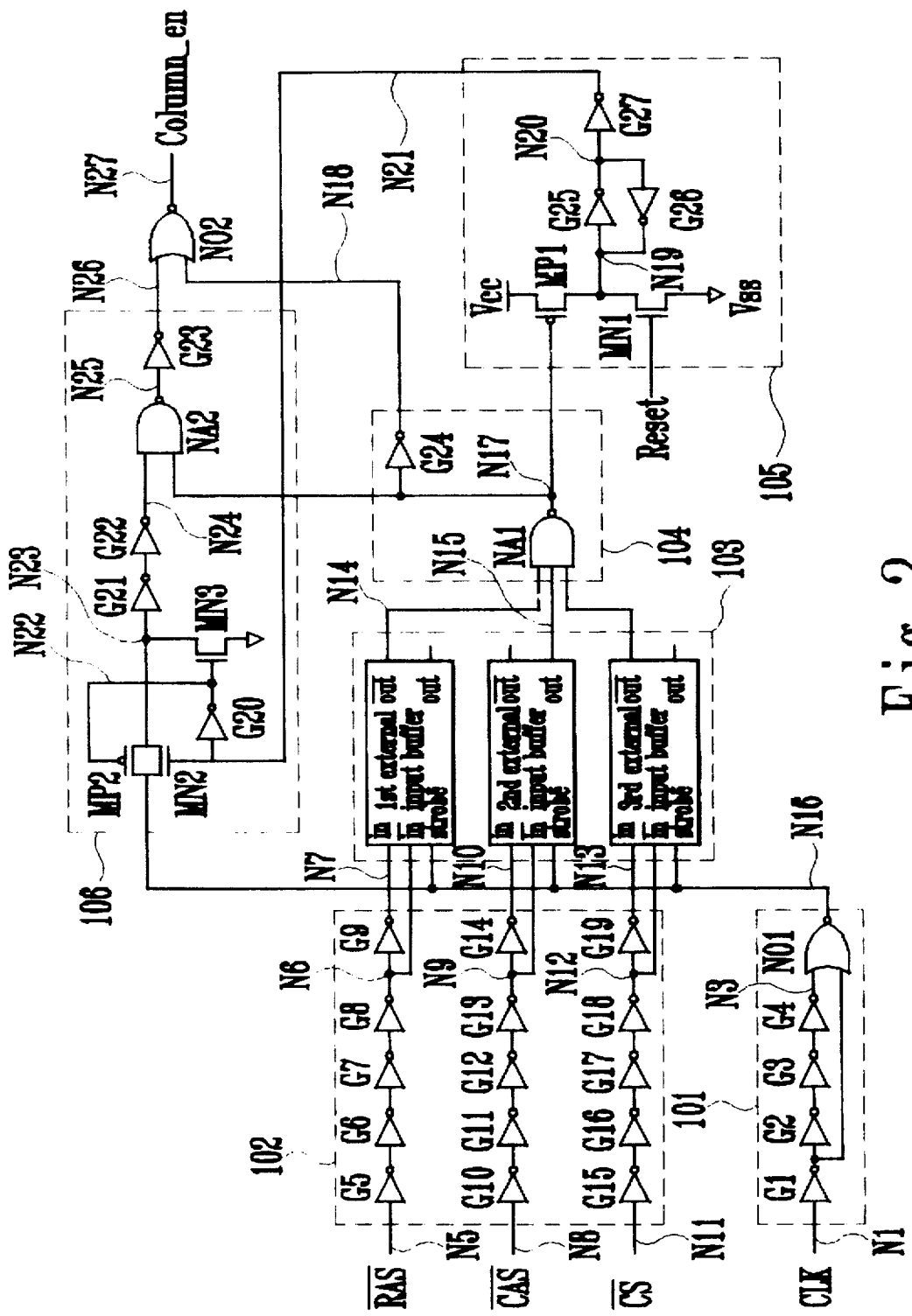
FIG. 2 is a circuit diagram illustrating the construction of an internal pulse signal generation circuit for an SDRAM in accordance with a first embodiment of the present invention.

FIG. 2 is a circuit diagram illustrating the construction of an internal pulse signal generation circuit for an SDRAM in accordance with a first embodiment of the present invention and FIGS. 3a to 3e are timing diagrams illustrating the operation of the internal pulse signal generation circuit in FIG. 2.

As shown in FIG. 2, the internal pulse signal generation circuit comprises an edge signal generator 101 for generating an edge signal with a pulse width corresponding to a predetermined delay time from an input clock signal CLK, and a delay circuit 102 including first to third delay elements. The first delay element delays a row address strobe bar signal/RAS and inverts the delayed signal. The second delay element delays a column address strobe bar signal/CAS and inverts the delayed signal. The third delay element delays a chip select signal/CS, and inverts the delayed signal.

The internal pulse signal generation circuit further comprises an external input buffer circuit 103 including first to third external input buffers. The first external input buffer receives the edge signal from the edge signal generator 101 at its strobe terminal and buffers the delayed signal and inverted signal from the first delay element in the delay circuit 102 in response to the received edge signal. The second external input buffer receives the edge signal from the edge signal generator 101 at its strobe terminal and buffers the delayed signal and inverted signal from the second delay element in the delay circuit 102 in response to the received edge signal. The third external input buffer receives the edge signal from the edge signal generator 101 at its strobe terminal and buffers the delayed signal and inverted signal from the third delay element in the delay circuit 12 in response to the received edge signal.

The internal pulse signal generation circuit further comprises a first internal pulse signal generator 104 for logically combining output signals from the first to third external input buffers in the external input buffer circuit 103 and generating a first pulse signal in accordance with the logically combined result to transfer an external column address to an internal column address line in response to a burst mode command, a flip-flop circuit 105 for generating an active select signal indicative of a burst mode operation start time in response to the first pulse signal from the first internal pulse signal generator 104 and an inactive select signal in response to a pulse signal RESET which is generated from a burst length sense circuit (not shown) when a predetermined number of burst cycles are completed, a second internal pulse signal generator 106 for generating a second pulse signal in response to the edge signal from the edge signal generator 101 when the flip-flop circuit 105 generates the active select signal, to transfer an internal column address from an internal column address counter to the internal column address line in each clock cycle, and blocking the edge signal from the edge signal generator 101 when the flip-flop circuit 105 generates the inactive select signal or a burst interrupt signal is applied, to suppress the generation of the second pulse signal, and a second NOR gate N02 for NORing the first and second pulse signals from the first and second internal pulse signal generators 104 and 106 and generating a column enable signal Column_en in accordance with the NORed result.

The edge signal generator 101 includes a first node N1 for receiving the clock signal CLK, a first inverter G1 connected between the first node N1 and a second node N2, second to fourth inverters G2–G4 connected in series between the second node N2 and a third node N3, and a first NOR gate N01 for NORing signals at the second and third nodes and outputting the NORed result to a fourth node N4. Generated at the fourth node N4 is an edge signal with a pulse width corresponding to a propagation delay time of the second to fourth inverters G2–G4.

The delay circuit 102 includes the first to third delay elements for delaying the row address strobe bar signal/RAS, column address strobe bar signal/CAS and chip select signal/CS and inverting the delayed signals, respectively.

Each of the first to third delay elements includes an inverter chain for matching the delayed signal and inverted signal with the edge signal from the edge signal generator 101. The inverter chain is provided with a plurality of inverters.

The first delay element includes a fifth node N5 for receiving the row address strobe bar signal/RAS, fifth to eighth inverters G5-G8 connected in series between the fifth node N5 and a sixth node N6, and a ninth inverter G9 connected between the sixth node N6 and a seventh node N7. A logic signal at the sixth node N6 has the same phase as that of the row address strobe bar signal/RAS at the fifth node N5, and a logic signal at the seventh node N7 has the opposite phase to that of the row address strobe bar signal/RAS at the fifth node N5.

The second delay element includes an eighth node N8 for receiving the column address strobe bar signal/CAS, tenth to thirteenth inverters G10-G13 connected in series between the eighth node N8 and a ninth node N9, and a fourteenth inverter G14 connected between the ninth node N9 and a tenth node N10. A logic signal at the ninth node N9 has the same phase as that of the column address strobe bar signal/CAS at the eighth node N8, and a logic signal at the tenth node N10 has the opposite phase to that of the column address strobe bar signal/CAS at the eighth node N8.

The third delay element includes an eleventh node N11 for receiving the chip select signal/CS, fifteenth to eighteenth inverters G15-G18 connected in series between the eleventh node N11 and a twelfth node N12, and a nineteenth inverter G19 connected between the twelfth node N12 and a thirteenth node N13. A logic signal at the twelfth node N12 has the same phase as that of the chip select signal/CS at the eleventh node N11, and a logic signal at the thirteenth node N13 has the opposite phase to that of the chip select signal/CS at the eleventh node N11.

The external input buffer circuit 103 includes the first to third external input buffers for receiving the edge signal from the edge signal generator 101 at their strobe terminals, buffering the delayed signals and inverted signals from the first to third delay elements in the delay circuit 102 in response to the received edge signal and outputting the buffered signals at their output terminals/out and out, respectively, which will be mentioned later in detail with reference to FIG. 8.

The first internal pulse signal generator 104 includes a first NAND gate NA1 for receiving an output signal from the output terminal/out of the first external input buffer in the external input buffer circuit 103 at a fourteenth node N14, an output signal from the output terminal out of the second external input buffer in the external input buffer circuit 103 at a fifteenth node N15 and an output signal from the output terminal out of the third external input buffer in the external input buffer circuit 103 at a sixteenth node N16, NANDing the received signals and outputting the NANDed result to a seventeenth node N17, and a twenty-fourth inverter G24 connected between the seventeenth node N17 and an eighteenth node N18. If the burst mode command is applied as shown in FIG. 1e under the condition that the row address strobe bar signal/RAS is high in logic, the column address strobe bar signal/CAS is low in logic and the chip select signal/CS is low in logic, an edge signal as shown in FIG. 3b is generated at the seventeenth node N17 at time T2. As a result, an inverted edge signal at the seventeenth node N17 is generated at the eighteenth node N18.

The flip-flop circuit 105 includes a first PMOS transistor MP1 connected between a supply voltage source Vcc and a nineteenth node N19 and having its gate connected to the seventeenth node N17, a first NMOS transistor MN1 connected between the nineteenth node N19 and a ground voltage source Vss and having its gate for inputting the pulse signal RESET from the burst length sense circuit, twenty-fifth and twenty-sixth inverters G25 and G26 connected in parallel between the nineteenth node N19 and a twentieth node N20, and a twenty-seventh inverter G27 connected between the twentieth node N20 and a twenty-first node N21. When the edge signal at the seventeenth node N17 in the first internal pulse signal generator 104 is low in logic, the first PMOS transistor MP1 is turned on to transfer a supply voltage from the supply voltage source Vcc to the nineteenth node N19. A signal at the twenty-first node N21 is maintained at its voltage level by a latched structure of the twenty-fifth and twenty-sixth inverters G25 and G26 between the nineteenth and twentieth nodes N19 and N20.

The second internal pulse signal generator 106 includes a twentieth inverter G20 connected between the twenty-first node N21 and a twenty-second node N22, and a transfer gate provided with a second PMOS transistor MP2 and a second NMOS transistor MN2 connected in parallel between the fourth node N4 which is the output node of the edge signal generator 101 and a twenty-third node N23. The second PMOS transistor MP2 has its gate connected to the twenty-second node N22, and the second NMOS transistor MN2 has its gate connected to the twenty-first node N21.

The second internal pulse signal generator 106 further includes a third NMOS transistor MN3 connected between the twenty-third node N23 and the ground voltage source Vss and having its gate connected to the twenty-second node N22, twenty-first and twenty-second inverters G21 and G22 connected in series between the twenty-third node N23 and a twenty-fourth node N24, a second NAND gate NA2 for NANDing signals at the twenty-fourth and seventeenth nodes N24 and N17 and outputting the NANDed result to a twenty-fifth node N25, and a twenty-third inverter G23 connected between the twenty-fifth node N25 and a twenty-sixth node N26.

If the signal at the output node N21 of the flip-flop circuit 105 is high in logic, the second PMOS transistor MP2 and second NMOS transistor MN2 of the transfer gate are turned on to transfer the edge signal at the output node N4 of the edge signal generator 101 to the twenty-third node N23. At this time, the edge signal at the output node N4 of the edge signal generator 101 has a high logic duration corresponding to a predetermined delay time from the input clock signal CLK. Then, a signal as shown in FIG. 3c is generated at the twenty-fourth node N24. The second NAND gate NA2 NANDs the signals at the twenty-fourth and seventeenth nodes N24 and N17 and outputs the NANDed result to the twenty-fifth node N25. The twenty-third inverter G23 inverts a signal at the twenty-fifth node N25 and outputs the inverted signal as shown in FIG. 3d to the twenty-sixth node N26. The second NOR gate N02 NORes signals at the twenty-sixth and eighteenth nodes N26 and N18 and outputs the NORed result as the column enable signal Column_en to a twenty-seventh node N27.

The operation of the internal pulse signal generation circuit with the above-mentioned construction in accordance with the first embodiment of the present invention will hereinafter be described in more detail.

When a burst mode command is applied, the first internal pulse signal generator 104 generates the first pulse signal ecasatv as shown in FIG. 3e at the eighteenth node N18 to transfer an external column address to the internal column address line in the corresponding clock cycle, so as to make a column cycle active. In the subsequent clock cycles, the second internal pulse signal generator 106 generates the second pulse signals icasatv as shown in FIG. 3d at the twenty-sixth node N26 to transfer internal column addresses from the internal column address counter to the internal column address line in the respective clock cycles. At this time, the internal column address counter generates the internal column addresses by counting the external column address.

Figure 3:
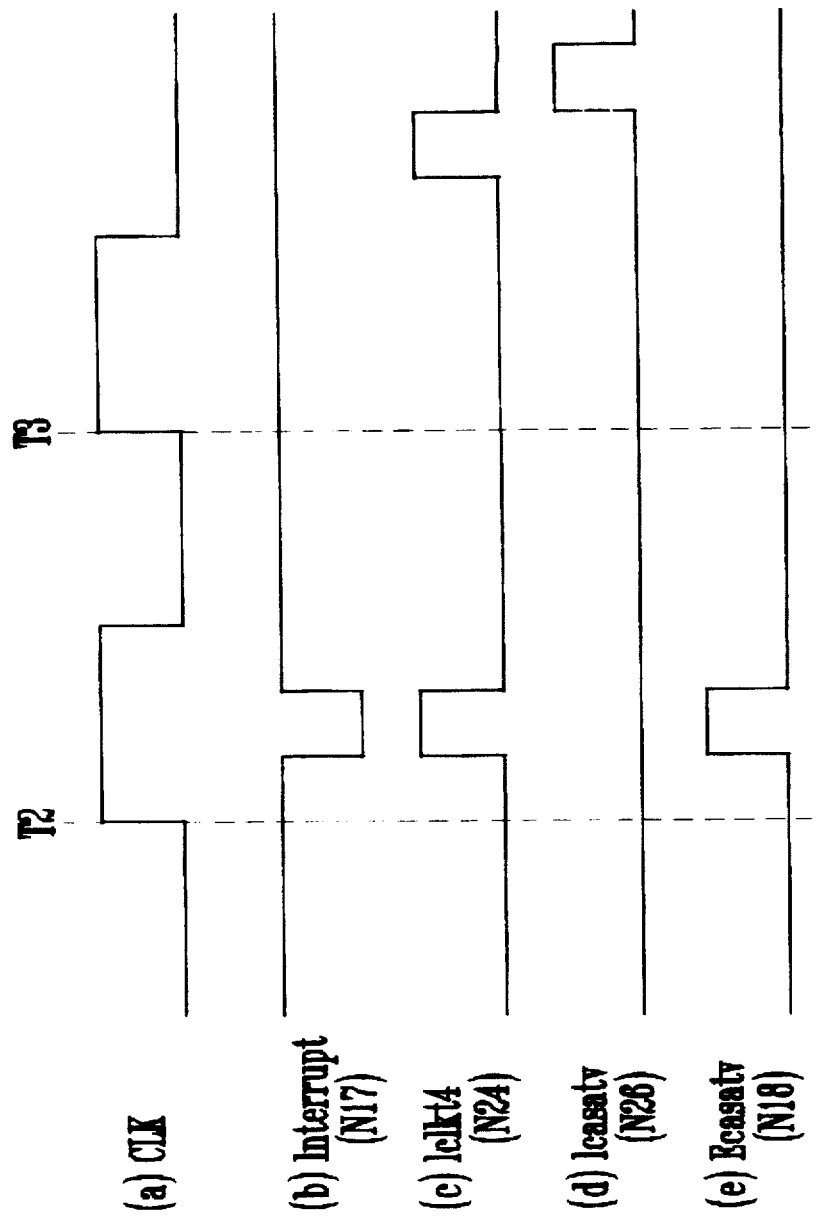
FIGS. 3a to 3e are timing diagrams illustrating the operation of the internal pulse signal generation circuit in FIG. 2.

When a burst interrupt is generated in burst mode operation at the time T2 in FIGS. 1 and 3 to perform the burst mode operation in response to a new external column address, the first internal pulse signal generator 104 generates the first pulse signal ecasatv as shown in FIG. 3e at the eighteenth node N18 and the second internal pulse signal generator 106 suppresses the generation of the second pulse signal icasatv as shown in FIG. 3d at the twenty-sixth node N26, so as to avoid the collision between the external and internal column addresses on the internal column address line. Therefore, the burst mode operation can normally be performed.

Figure 4:
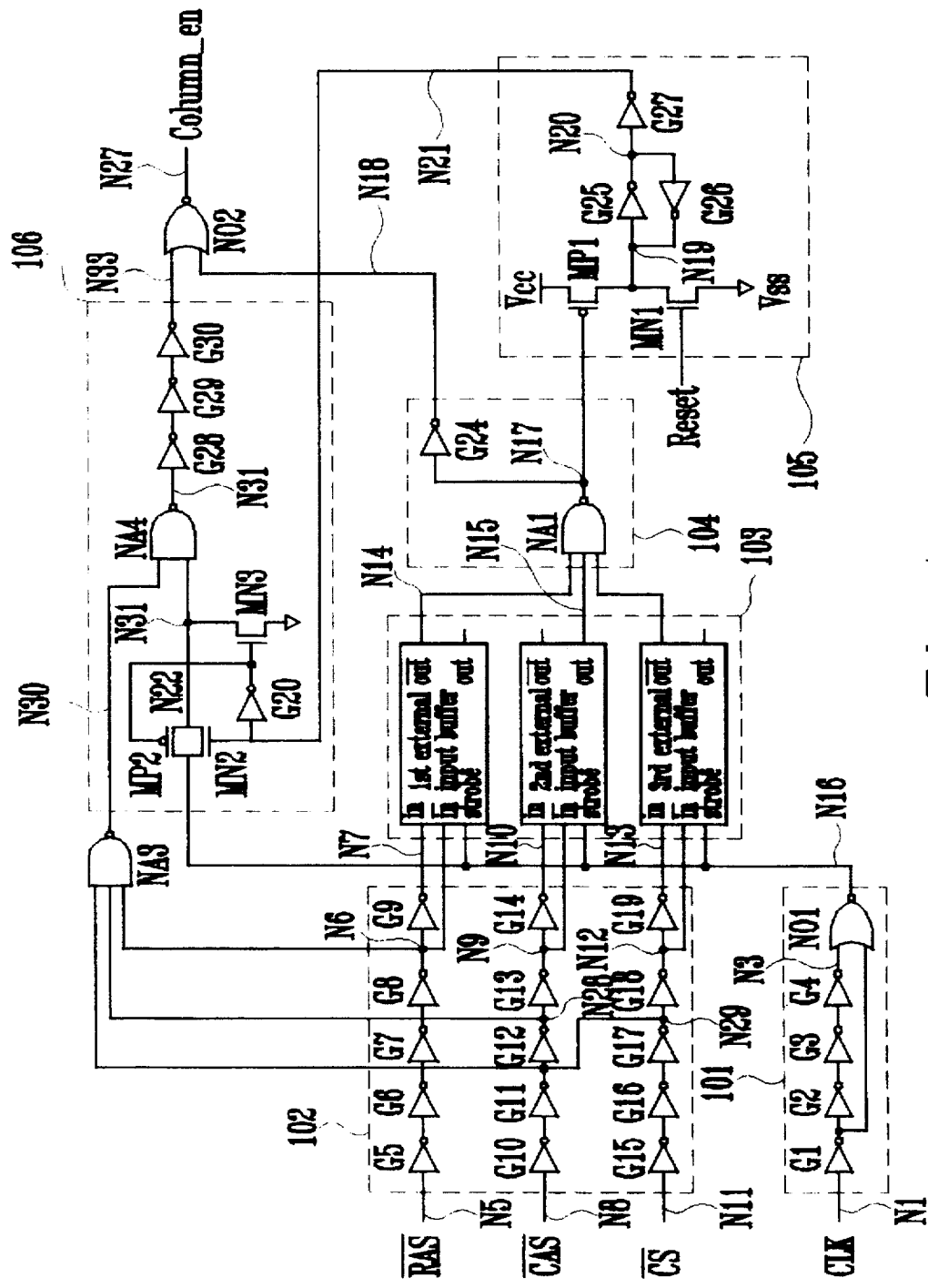
FIG. 4 is a circuit diagram illustrating the construction of an internal pulse signal generation circuit for an SDRAM in accordance with a second embodiment of the present invention.

FIG. 4 is a circuit diagram illustrating the construction of an internal pulse signal generation circuit for an SDRAM in accordance with a second embodiment of the present invention and FIGS. 5a to 5i are timing diagrams illustrating the operation of the internal pulse signal generation circuit in FIG. 4.

As shown in FIG. 4, the second embodiment of the present invention has the same construction as that of the first embodiment in FIG. 2, with the exception that the delay circuit 102 and second internal pulse signal generator 106 have different arrangements.

The delay circuit 102 includes first to third delay elements for delaying the row address strobe bar signal/RAS, column address strobe bar signal/CAS and chip select signal/CS and inverting the delayed signals, respectively. Each of the first to third delay elements includes an inverter chain. The inverter chain is provided with a plurality of inverters.

The first delay element includes a fifth node N5 for receiving the row address strobe bar signal/RAS, fifth to eighth inverters G5–G8 connected in series between the fifth node N5 and a sixth node N6, and a ninth inverter G9 connected between the sixth node N6 and a seventh node N7. A logic signal at the sixth node N6 has the same phase as that of the row address strobe bar signal/RAS at the fifth node N5, and a logic signal at the seventh node N7 has the opposite phase to that of the row address strobe bar signal /RAS at the fifth node N5.

The second delay element includes an eighth node N8 for receiving the column address strobe bar signal/CAS, tenth to twelfth inverters G10–G12 connected in series between the eighth node N8 and a twenty-eighth node N28, a thirteenth inverter G13 connected between the twenty-eighth node N28 and a ninth node N9, and a fourteenth inverter G14 connected between the ninth node N9 and a tenth node N10. A logic signal at the ninth node N9 has the same phase as that of the column address strobe bar signal/CAS at the eighth node N8, and logic signals at the twenty-eighth and tenth nodes N28 and N10 have phases opposite that of the column address strobe bar signal/CAS at the eighth node N8.

The third delay element includes an eleventh node N11 for receiving the chip select signal/CS, fifteenth to seventeenth inverters G15–G17 connected in series between the eleventh node N11 and a twenty-ninth node N29, an eighteenth inverter G18 connected between the twenty-ninth node N29 and a twelfth node N12, and a nineteenth inverter G19 connected between the twelfth node N12 and a thirteenth node N13. A logic signal at the twelfth node N12 has the same phase as that of the chip select signal/CS at the eleventh node N11, and logic signals at the twenty-ninth and thirteenth nodes N29 and N13 have phases opposite that of the chip select signal/CS at the eleventh node N11.

In the second embodiment of the present invention, the internal pulse signal generation circuit further comprises a third NAND gate NA3 for NANDing signals at the sixth, twenty-eighth and twenty-ninth nodes N6, N28 and N29 and outputting the NANDed result to a thirtieth node N30.

The second internal pulse signal generator 106 includes a twentieth inverter G20 connected between a twenty-first node N21 and a twenty-second node N22, and a transfer gate provided with a second PMOS transistor MP2 and a second NMOS transistor MN2 connected in parallel between a fourth node N4 which is an output node of the edge signal generator 101 and a thirty-first node N31. The second PMOS transistor MP2 has its gate connected to the twenty-second node N22 and the second NMOS transistor MN2 has its gate connected to the twenty-first node N21.

The second internal pulse signal generator 106 further includes a third NMOS transistor MN3 connected between the thirty-first node N31 and the ground voltage source Vss and having its gate connected to the twenty-second node N22, a fourth NAND gate NA4 for NANDing signals at the thirtieth and thirty-first nodes N30 and N31 and outputting the NANDed result to a thirty-second node N32, and twenty-eighth to thirtieth inverters G28 and G30 connected in series between the thirty-second node N32 and a thirty-third node N33. The second NOR gate NO2 NOREs signals at the thirty-third and eighteenth nodes N33 and N18 and outputs the NOREd result as the column enable signal Column_en to the twenty-seventh node N27.

The operation of the internal pulse signal generation circuit with the above-mentioned construction in accordance with the second embodiment of the present invention will hereinafter be described in detail.

If the edge signal is generated at the output node N4 of the edge signal detector 101 when the clock signal CLK is high in logic, it is then transferred to the thirty-first node N31 by the second PMOS transistor MP2 and second NMOS transistor MN2 of the transfer gate and applied to the input terminal of the fourth NAND gate NA4. The third NAND gate NA3 NANDs signals at the sixth, twenty-eighth and twenty-ninth nodes N6, N28 and N29 which are intermediate output nodes of the delay circuit 102 and outputs the NANDed result to the thirtieth node N30. At this time, a pulse signal as shown in FIG. 5e at the output node N30 of the third NAND gate NA3 is generated earlier than a pulse signal as shown in FIG. 5f at the output node N4 of the edge signal detector 101. Noticeably, the second pulse signal at the output node N33 of the second internal pulse signal generator 106 is controlled according to voltage levels of the signals at the thirtieth and thirty-first nodes N30 and N31 to transfer an internal column address from the internal column address counter to the internal column address line. The pulse signal as shown in FIG. 5e at the output node N30 of the third NAND gate NA3 is generated earlier and returned later than the pulse signal as shown in FIG. 5f at the output node N4 of the edge signal detector 101. To this end, the pulse signal at the output node N30 of the third NAND gate NA3 has a sufficiently wide pulse width. The pulse signal at the output node N30 of the third NAND gate NA3 has no effect on the pulse signal as shown in FIG. 5h at the thirty-third node N33.

Figure 5:
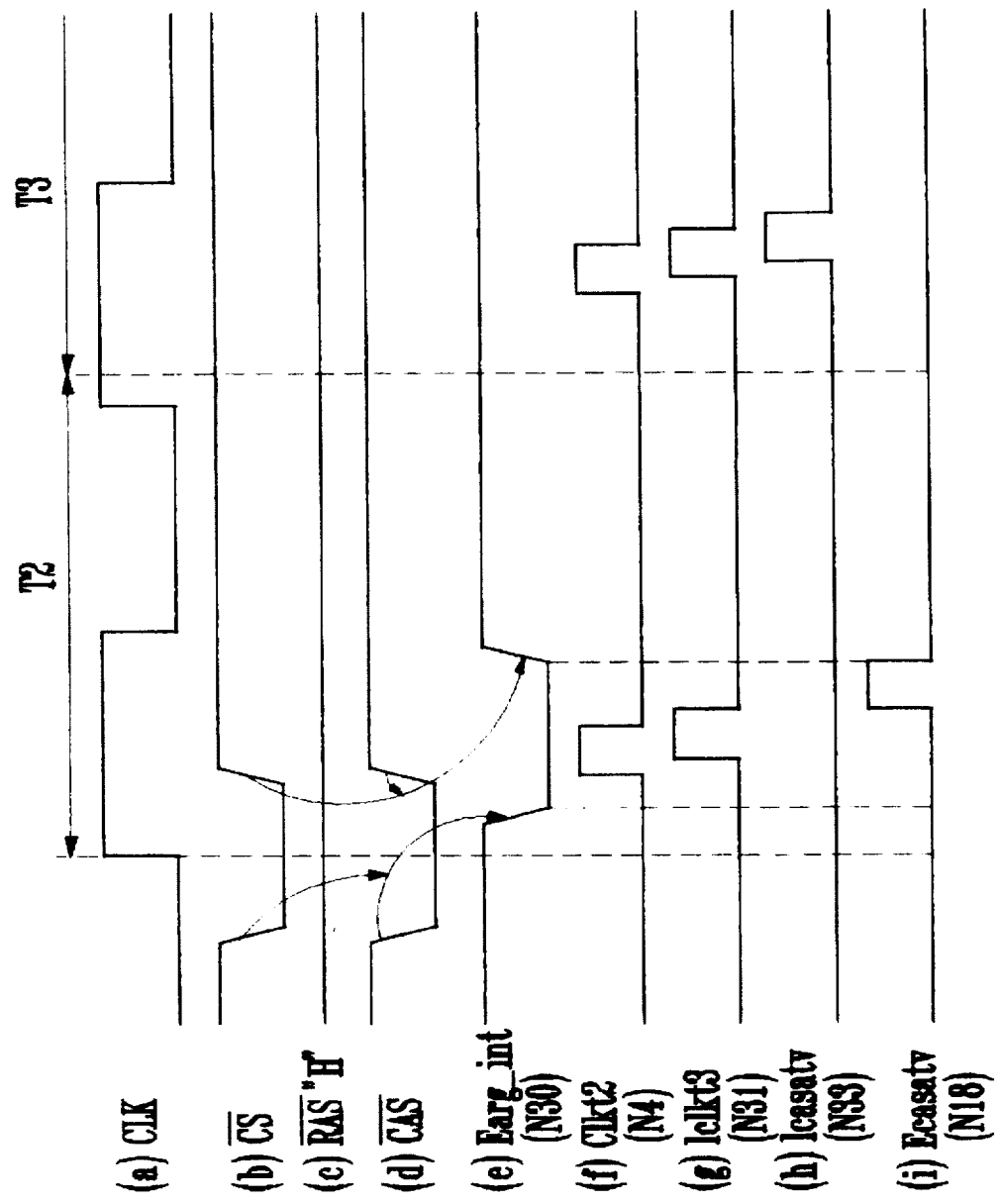
FIGS. 5a to 5i are timing diagrams illustrating the operation of the internal pulse signal generation circuit in FIG. 4.

When a burst interrupt is generated in burst mode operation at the interval T2 in FIGS. 1 and 5 to perform the burst mode operation in response to a new external column address, the first internal pulse signal generator 104 generates the first pulse signal ecasatv as shown in FIG. 5i at the eighteenth node N18 and the second internal pulse signal generator 106 suppresses the generation of the second pulse signal icasatv as shown in FIG. 5h at the thirty-third node N33, so as to avoid the collision between the external and internal column addresses on the internal column address line. Therefore, the burst mode operation can be performed normally.

Figure 6:
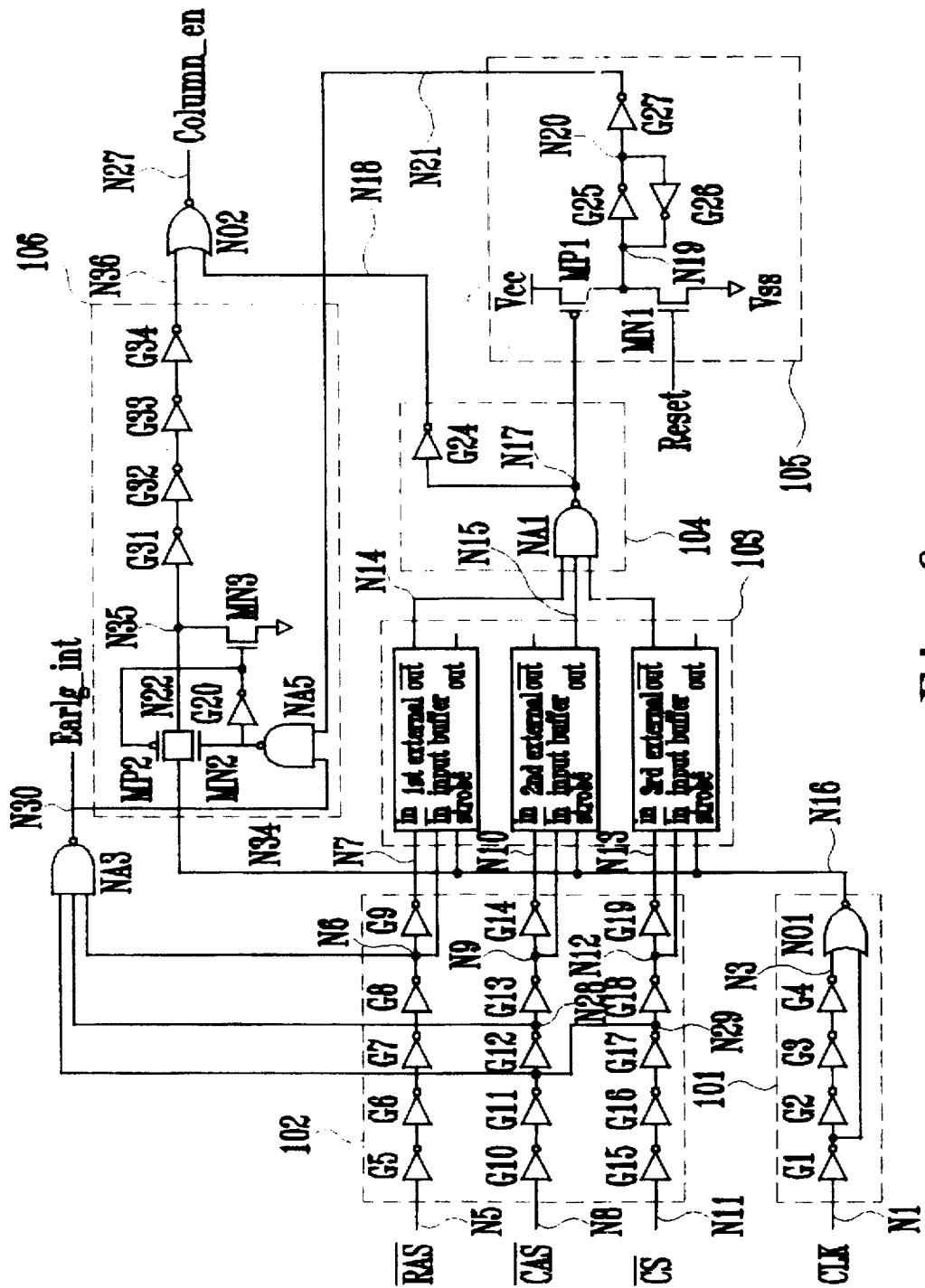
FIG. 6 is a circuit diagram illustrating the construction of an internal pulse signal generation circuit for an SDRAM in accordance with a third embodiment of the present invention.

FIG. 6 is a circuit diagram illustrating the construction of an internal pulse signal generation circuit for an SDRAM in accordance with a third embodiment of the present invention and FIGS. 7a to 7j are timing diagrams illustrating the operation of the internal pulse signal generation circuit in FIG. 6.

As shown in FIG. 6, the third embodiment of the present invention has the same construction as that of the second embodiment in FIG. 4, with the exception that the second internal pulse signal generator 106 has a different arrangement.

The second internal pulse signal generator 106 includes a fifth NAND gate NA5 for NANDing signals at thirtieth and twenty-first nodes N30 and N21 and outputting the NANDed result to a thirty-fourth node N34, a twentieth inverter G20 connected between the thirty-fourth node N34 and a twenty-second node N22, and a transfer gate provided with a second PMOS transistor MP2 and a second NMOS transistor MN2 connected in parallel between a fourth node N4 which is an output node of the edge signal generator 101 and a thirty-fifth node N35. The second PMOS transistor MP2 has its gate connected to the thirty-fourth node N34 and the second NMOS transistor MN2 has its gate connected to the twenty-second node N22.

The second internal pulse signal generator 106 further includes a third NMOS transistor MN3 connected between the thirty-fifth node N35 and the ground voltage source Vss and having its gate connected to the twenty-second node N22, and thirty-first to thirty-fourth inverters G31–G34 connected in series between the thirty-fifth node N35 and a thirty-sixth node N36. The second NOR gate N02 NORes signals at the thirty-sixth and eighteenth nodes N36 and N18 and outputs the NORed result as the column enable signal Column_en to the twenty-seventh node N27.

The operation of the internal pulse signal generation circuit with the above-mentioned construction in accordance with the third embodiment of the present invention will hereinafter be described in detail.

First, a pulse signal as shown in FIG. 7h is generated at the output node N4 of the edge signal detector 101 when the clock signal CLK is high in logic. Signals at the sixth, twenty-eighth and twenty-ninth nodes N6, N28 and N29 which are intermediate output nodes of the delay circuit 102 are all high in logic in response to the row address strobe bar signal/RAS, column address strobe bar signal/CAS and chip select signal/CS. As a result, a pulse signal as shown in FIG. 7e at the output node N30 of the third NAND gate NA3 is low in logic. At this time, the pulse signal as shown in FIG. 7e at the output node N30 of the third NAND gate NA3 is generated earlier than the pulse signal as shown in FIG. 7h at the output node N4 of the edge signal detector 101.

A signal at the output node N34 of the fifth NAND gate NA5 becomes high in logic in response to the signals at the thirtieth and twenty-first nodes N30 and N21, thereby causing the second PMOS transistor MP2 and second NMOS transistor MN2 of the transfer gate to be turned off. As the second PMOS transistor MP2 and second NMOS transistor MN2 of the transfer gate are turned off, they block the input of the pulse signal at the output node N4 of the edge signal detector 101. As a result, the second pulse signal as shown in FIG. 7i at the thirty-sixth N36 is suppressed in generation, so that any internal column address from the internal column address counter cannot be transferred to the internal column address line. Noticeably, the pulse signal as shown in FIG. 7e at the output node N30 of the third NAND gate NA3 is generated earlier and returned later than the pulse signal as shown in FIG. 7h at the output node N4 of the edge signal detector 101. To this end, the pulse signal at the output node N30 of the third NAND gate NA3 has a sufficiently wide pulse width. The pulse signal at the output node N30 of the third NAND gate NA3 has no effect on the pulse signal as shown in FIG. 7i at the thirty-sixth node N36.

Figure 7:
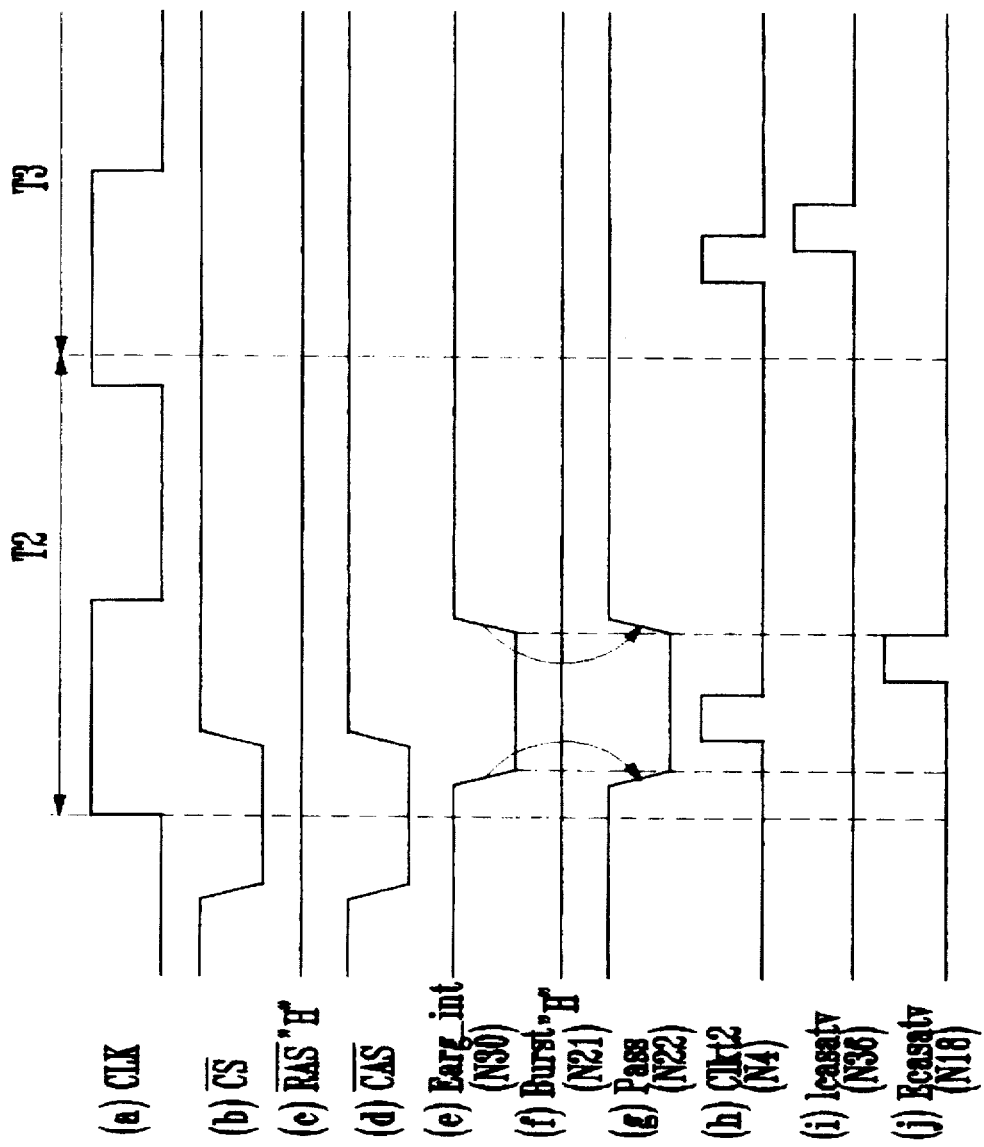
FIGS. 7a to 7j are timing diagrams illustrating the operation of the internal pulse signal generation circuit in FIG. 6.

When a burst interrupt is generated in burst mode operation at the interval T2 in FIGS. 1 and 7 to perform the burst mode operation in response to a new external column address, the first internal pulse signal generator 104 generates the first pulse signal ecasatv as shown in FIG. 7j at the eighteenth node N18 and the second internal pulse signal generator 106 suppresses the generation of the second pulse signal icasatv as shown in FIG. 7i at the thirty-sixth node N36, so as to avoid the collision between the external and internal column addresses on the internal column address line. Therefore, the burst mode operation can be performed normally.

Figure 8:
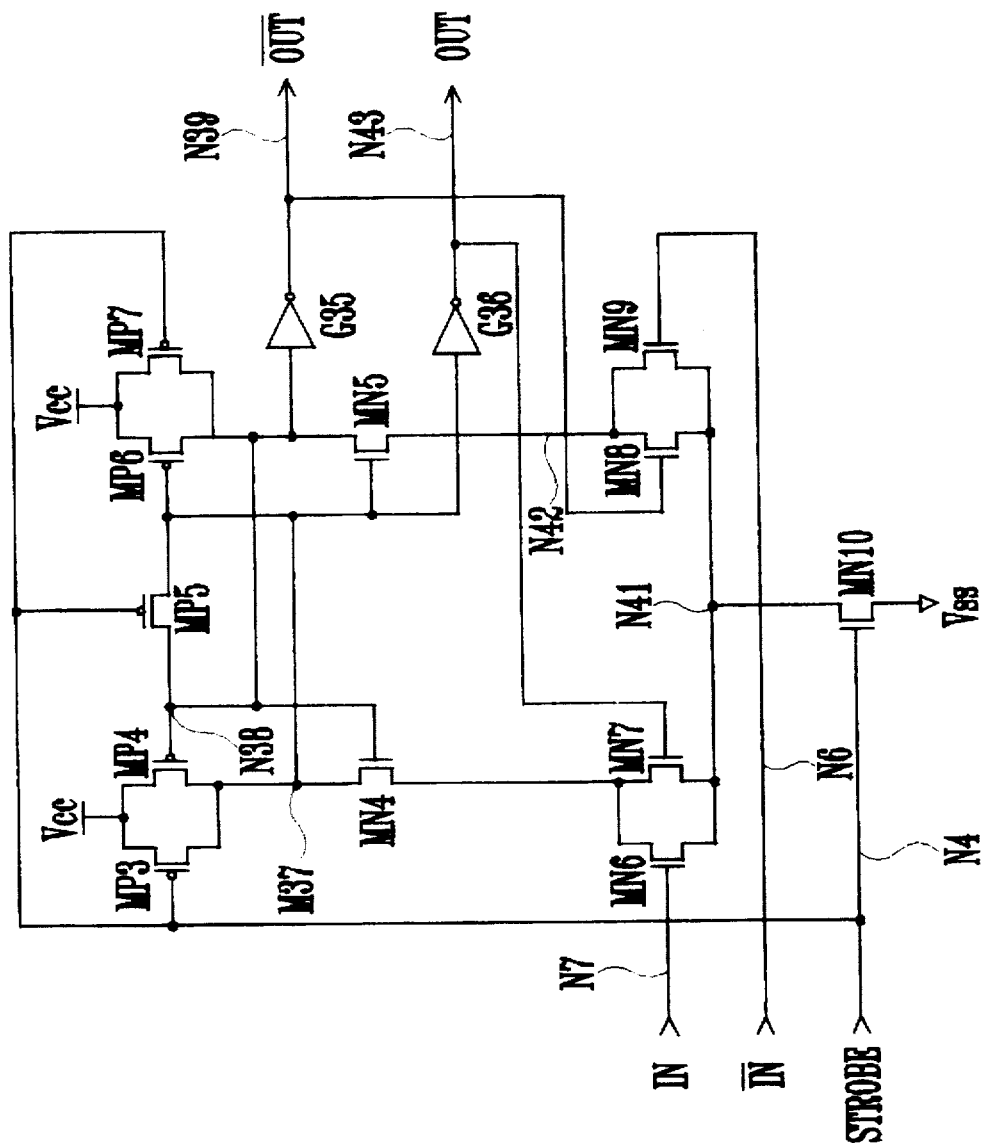
FIG. 8 is a detailed circuit diagram illustrating the construction of each of external input buffers in FIGS. 2, 4 and 6.

FIG. 8 is a detailed circuit diagram illustrating the construction of each of the external input buffers in the external input buffer circuit 103 in FIGS. 2, 4 and 6. The external input buffer circuit 103 includes the first to third external input buffers. The first external input buffer receives the edge signal from the edge signal generator 101 at its strobe terminal and the delayed signal and inverted signal at the output nodes N6 and N7 of the first delay element in the delay circuit 102. The second external input buffer receives the edge signal from the edge signal generator 101 at its strobe terminal and the delayed signal and inverted signal at the output nodes N9 and N10 of the second delay element in the delay circuit 102. The third external input buffer receives the edge signal from the edge signal generator 101 at its strobe terminal and the delayed signal and inverted signal at the output nodes N12 and N13 of the third delay element in the delay circuit 102. The first to third external input buffers in the external input buffer circuit 103 are the same in construction. Thus, only the construction of the first external input buffer will hereinafter be described as an example.

As shown in FIG. 8, the first external input buffer includes third and fourth PMOS transistors MP3 and MP4 connected in parallel between the supply voltage source Vcc and a thirty-seventh node N37, and a fourth NMOS transistor MN4 connected between the thirty-seventh node N37 and a fortieth node N40. The third PMOS transistor MP3 has its gate connected to the output node N4 of the edge signal generator 101, and the fourth PMOS transistor MP4 and fourth NMOS transistor MN4 have their gates connected in common to a thirty-eighth node N38.

The first external input buffer further includes sixth and seventh NMOS transistors MN6 and MN7 connected in parallel between the fortieth node N40 and a forty-first node N41, and a tenth NMOS transistor MN10 connected between the forty-first node N41 and the ground voltage source Vss. The sixth NMOS transistor MN6 has its gate connected to the seventh node N7, the seventh NMOS transistor MN7 has its gate connected to a forty-third node N43 which is the second output terminal out, and the tenth NMOS transistor MN10 has its gate connected to the fourth node N4.

The first external input buffer further includes a fifth PMOS transistor MP5 connected between the thirty-eighth and thirty-seventh nodes N38 and N37, and sixth and seventh PMOS transistors MP6 and MP7 connected in parallel between the supply voltage source Vcc and the thirty-eighth node N38. The sixth PMOS transistor MP6 has its gate connected to the thirty-seventh node N37, and the fifth and seventh PMOS transistors MP5 and MP7 have their gates connected in common to the fourth node N4.

The first external input buffer further includes a thirty-fifth inverter G35 connected between the thirty-eighth node N38 and a thirty-ninth node N39 which is the first output terminal/out, a fifth NMOS transistor MN5 connected between the thirty-eighth node N38 and a forty-second node N42, a thirty-sixth inverter G36 connected between the thirty-seventh node N37 and the forty-third node N43, and eighth and ninth NMOS transistors MN8 and MN9 connected in parallel between the forty-second node N42 and the forty-first node N41. The fifth NMOS transistor MN5 has its gate connected to the thirty-seventh node N37, the eighth NMOS transistor MN8 has its gate connected to the thirty-ninth node N39, and the ninth NMOS transistor MN9 has its gate connected to the sixth node N6.

The operation of the first external input buffer with the above-mentioned construction in accordance with the present invention will hereinafter be described in detail.

When the edge signal at the output node N4 of the edge signal generator 101 is high in logic, the tenth NMOS transistor MN10 is turned on and the third, fifth, sixth and seventh PMOS transistors MP3, MP5, MP6 and MP7 are turned off. Also, the signals at the sixth and seventh nodes N6 and N7 are high and low in logic, respectively, because the row address strobe bar signal/RAS is high in logic. As a result, the eighth and ninth NMOS transistors MN8 and MN9 are turned on, thereby causing a high logic signal to be transferred to the first output terminal N39 and a low logic signal to be transferred to the second output terminal N43.

As is apparent from the above description, according to the present invention, in the SDRAM, when a burst interrupt is generated in burst mode operation to perform the burst mode operation in response to a new external column address, the collision between the external and internal column addresses on the internal column address line can be prevented. Therefore, the burst mode operation can be performed normally.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for generating internal pulse signals in a synchronous memory, comprising the steps of:

(a) generating a first pulse signal in response to a burst mode command to transfer an external column address to an internal column address line;

(b) generating a second pulse signal after the generation of said first pulse signal at said step (a) to transfer an internal column address from an internal column address counter to said internal column address line in each clock cycle until said burst mode operation is advanced by a predetermined burst length; and (c) generating said first pulse signal and suppressing the generation of said second pulse signal, when a burst interrupt is generated in burst mode operation to perform said burst mode operation in response to a new external column address.

2. A circuit for generating internal pulse signals in a synchronous memory, comprising:

edge signal generation means for generating an edge signal with a pulse width corresponding to a predetermined delay time from an input clock signal;

first delay means for delaying a row address strobe bar signal and inverting the delayed signal;

second delay means for delaying a column address strobe bar signal and inverting the delayed signal;

third delay means for delaying a chip select signal and inverting the delayed signal;

first external input buffer means for receiving the edge signal from said edge signal generation means at its strobe terminal and buffering the delayed signal and inverted signal from said first delay means in response to the received edge signal;

second external input buffer means for receiving the edge signal from said edge signal generation means at its strobe terminal and buffering the delayed signal and inverted signal from said second delay means in response to the received edge signal;

third external input buffer means for receiving the edge signal from said edge signal generation means at its strobe terminal and buffering the delayed signal and inverted signal from said third delay means in response to the received edge signal;

first internal pulse signal generation means for logically combining output signals from said first to third external input buffer means and generating a first pulse signal in accordance with the logically combined result to transfer an external column address to an internal column address line in response to a burst mode command;

flip-flop means for generating an active select signal indicative of a burst mode operation start time in response to the first pulse signal from said first internal pulse signal generation means and an inactive select signal in response to a pulse signal which is generated from a burst length sense circuit when a predetermined number of burst cycles are completed;

second internal pulse signal generation means for generating a second pulse signal in response to the edge signal from said edge signal generation when said flip-flop means generate the active select signal, to transfer an internal column address from an internal column address counter to said internal column address line in each clock cycle, and blocking the edge signal from said edge signal generation means when said flip-flop means generates the inactive select signal or a burst interrupt signal is applied, to suppress the generation of the second pulse signal; and logic means for logically combining the first and second pulse signals from said first and second internal pulse signal generation means and generating a column enable signal in accordance with the logically combined result.

3. A circuit for generating internal pulse signals in a synchronous memory, as set forth in claim 2, wherein said second internal pulse signal generation means is adapted to generate the second pulse signal by logically combining the edge signal from said edge signal generation means with the first pulse signal from said first internal pulse signal generation means.

4. A circuit for generating internal pulse signals in a synchronous memory, as set forth in claim 2, wherein said second internal pulse signal generation means is adapted to generate the second pulse signal by logically combining the edge signal from said edge signal generation means with a signal which is obtained by logically combining output signals from said first to third delay means.

5. A circuit for generating internal pulse signals in a synchronous memory, as set forth in claim 2, wherein said second internal pulse signal generation means is adapted to generate the second pulse signal by logically combining an output signal from said flip-flop means with a signal which is obtained by logically combining output signals from said first to third delay means, selecting the edge signal from said edge signal generation means in accordance with the logically combined result and delaying the selected edge signal through an even number of inverters.

* * * * *

UNITED STATES PATENT AND TRADEMARK OFFICE
CERTIFICATE OF CORRECTION

PATENT NO. : 5,781,500
DATED : July 14, 1998
INVENTOR(S) : Jong Hoon Oh

It is certified that error appears in the above-identified patent and that said Letters Patent is hereby corrected as shown below:

The title page, should be deleted to appear as per attached title page.

United States Patent [19]

Oh

[11] Patent Number: 5,781,500
[45] Date of Patent: Jul. 14, 1998

[54] METHOD AND CIRCUIT FOR GENERATING INTERNAL PULSE SIGNALS IN SYNCHRONOUS MEMORY

[75] Inventor: Jong Hoon Oh, Kyoungki-do, Rep. of Korea

[73] Assignee: Hyundai Electronics Industries Co., Ltd., Kyoungki-do, Rep. of Korea

[21] Appl. No.: 850,247

[22] Filed: May 2, 1997

[30] Foreign Application Priority Data

May 6, 1996 [KR] Rep. of Korea .................. 199614688

[51] Int. Cl.⁶ ............................................. G11C 8/00
[52] U.S. Cl. ............................................. 365/233; 365/194
[58] Field of Search ............................... 365/233, 194, 365/193, 236

[56] References Cited

U.S. PATENT DOCUMENTS

| | | | |
|---|---|---|---|
| 4,984,216 | 1/1991 | Toda et al. | 365/230.08 |
| 5,392,239 | 2/1995 | Margulis et al. | 365/233 |
| 5,568,445 | 10/1996 | Park et al. | 365/233 |
| 5,598,376 | 1/1997 | Merritt et al. | 365/233 |
| 5,610,864 | 3/1997 | Manning | 365/193 |
| 5,610,874 | 3/1997 | Park et al. | 365/236 |
| 5,652,724 | 7/1997 | Manning | 365/189.05 |
| 5,673,233 | 9/1997 | Wright et al. | 365/233 |

*Primary Examiner*—Son T. Dinh
*Attorney, Agent, or Firm*—Merchant Gould Smith Edell Welter and Schmidt

[57] ABSTRACT

A method and a circuit for generating internal pulse signals in a synchronous memory is provided. A first pulse signal is generated in response to a burst mode command to transfer an external column address to an internal column address line. After the generation of the first pulse signal, a second pulse signal is generated to transfer an internal column address from an internal column address counter to the internal column address line in each clock cycle until the burst mode operation is advanced by a predetermined burst length. When a burst interrupt is generated in burst mode operation to perform the burst mode operation in response to a new external column address, the first pulse signal is generated and the generation of the second pulse signal is suppressed.

5 Claims, 8 Drawing Sheets

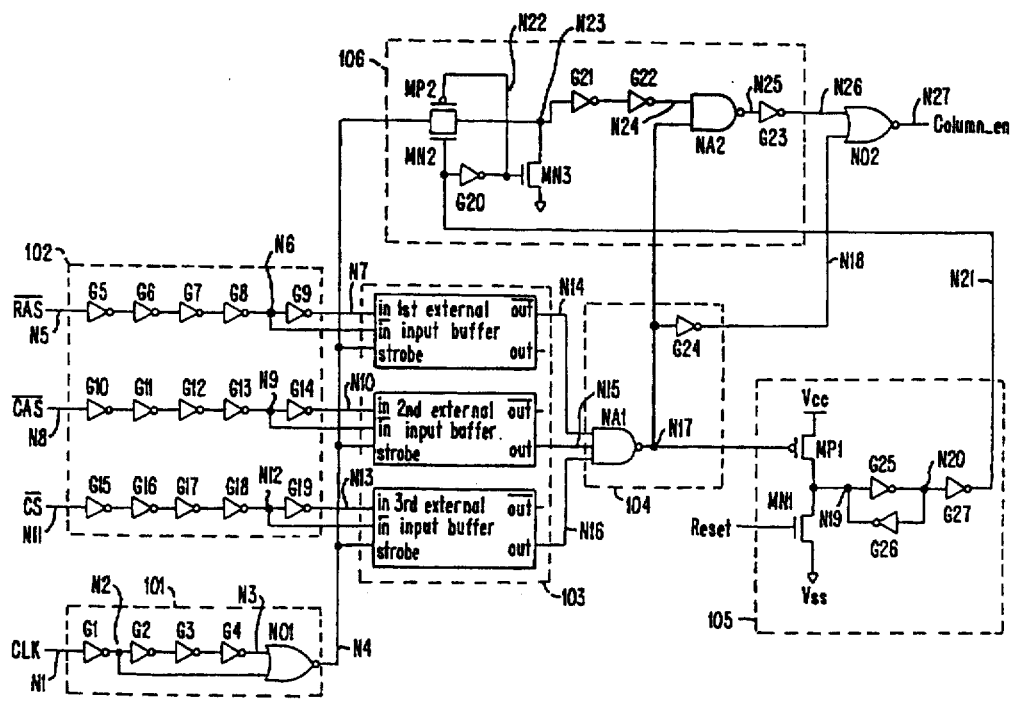

UNITED STATES PATENT AND TRADEMARK OFFICE
CERTIFICATE OF CORRECTION

PATENT NO.  : 5,781,500
DATED       : July 14, 1998
INVENTOR(S) : Jong Hoon Oh

It is certified that error appears in the above-identified patent and that said Letters Patent is hereby corrected as shown below:

Drawings,
Sheet 1, Fig. 1(a), "T0" to the right of "T2" is changed to -- T3 --.

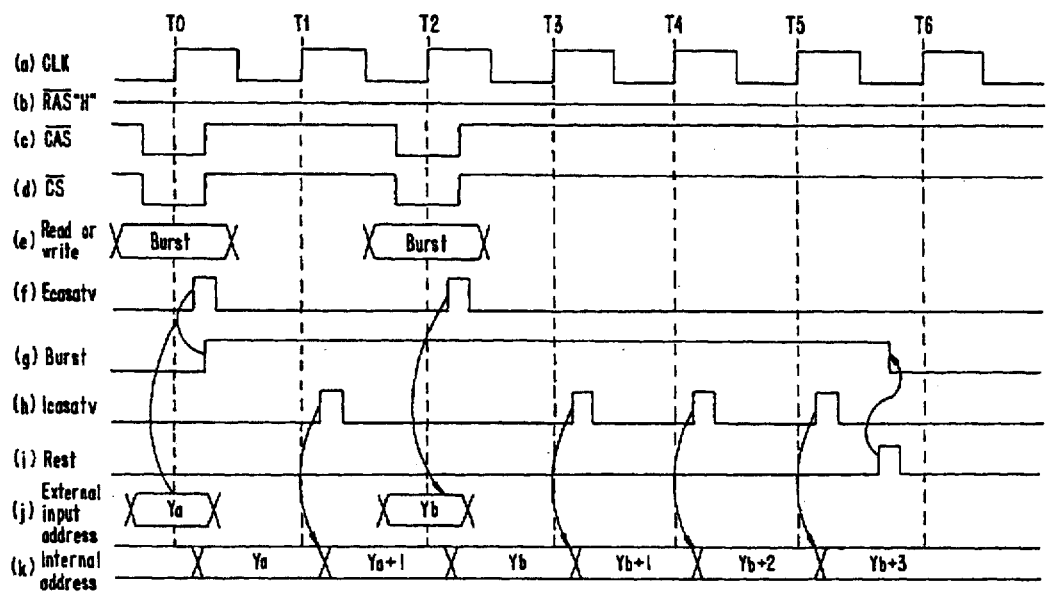

Fig. 1.

UNITED STATES PATENT AND TRADEMARK OFFICE
CERTIFICATE OF CORRECTION

PATENT NO.   : 5,781,500
DATED        : July 14, 1998
INVENTOR(S)  : Jong Hoon Oh Page 4 of 7

It is certified that error appears in the above-identified patent and that said Letters Patent is hereby corrected as shown below:

Sheet 2,
Fig. 2, the node number at the output node of the edge signal generator 101 is changed from "N16" to -- N4 --; an input terminal of NAND gate NA1 previously connected to the "out" terminal of the 3rd External Input Buffer in block 103 is now connected to the "out" terminal of the 3rd External Input Buffer, and is labeled as node -- N16 --; a bubble indicating an electrical connection between the input of inverter G20, gate of transistor MN2, and output of flip flop block 105 is added; and the node between inverters G1 and G2 in block 101 is marked with -- N2 --.

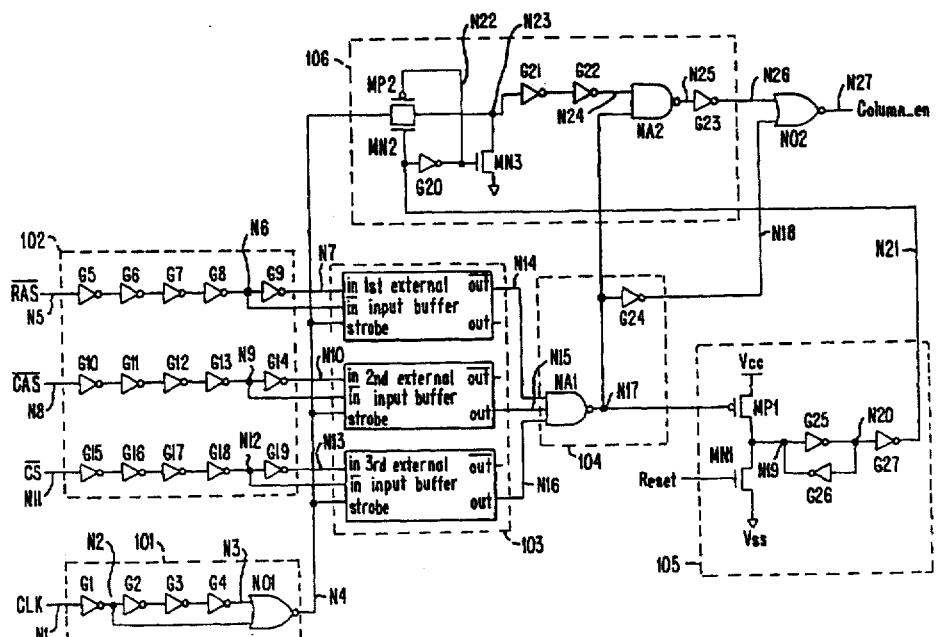

Fig. 2.

UNITED STATES PATENT AND TRADEMARK OFFICE
CERTIFICATE OF CORRECTION

PATENT NO. : 5,781,500
DATED : July 14, 1998
INVENTOR(S) : Jong Hoon Oh

It is certified that error appears in the above-identified patent and that said Letters Patent is hereby corrected as shown below:

Sheet 4,
Fig. 4, the node number at the output node of the edge signal generator 101 is changed from "N16" to -- N4 --; an input terminal of NAND gate NA1 previously connected to the "out" terminal of the 3rd External Input Buffer in block 103 is now connected to the "out" terminal of the 3rd External Input Buffer, and is labeled as node -- N16 --; a bubble indicating an electrical connection between the input of inverter G20, gate of transistor MN2, and output of flip flop block 105 is added; the previously floating label N22 now marks the gate of transistor MP2; the bubble between inverters G11 and G12 in the delay circuit 102 is removed to eliminate the electrical connection between this node and node N29 and input of NAND gate NA3; and the node between inverters G1 and G2 in block 101 is marked with -- N2 --.

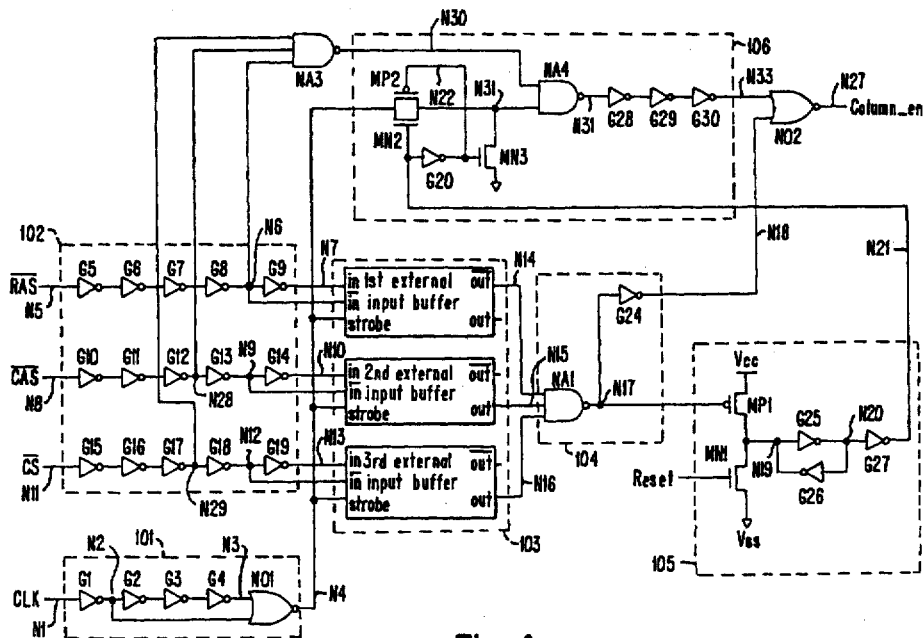

Fig. 4.

UNITED STATES PATENT AND TRADEMARK OFFICE
CERTIFICATE OF CORRECTION

PATENT NO. : 5,781,500
DATED : July 14, 1998
INVENTOR(S) : Jong Hoon Oh

It is certified that error appears in the above-identified patent and that said Letters Patent is hereby corrected as shown below:

<u>Sheet 6</u>,
Fig. 6, the node number at the output node of the edge signal generator 101 is changed from "N16" to -- N4 --; an input terminal of NAND gate NA1 previously connected to the "out" terminal of the 3rd External Input Buffer in block 103 is now connected to the "out" terminal of the 3rd External Input Buffer, and is labeled as node -- N16 --; the bubble between inverters G11 and G12 in the delay circuit 102 is removed to eliminate he electrical connection between this node and node N29 and input of NAND gate NA3; a bubble indicating an electrical connection between the input of inverter G20, the output of NAND gate NA5, and the gate of transistor MP2 is added; a bubble indicating an electrical connection between the output of NAND gate NA3 and an input of NAND gate NA5 is added; the gate connections of transistors MP2 and MN2 in block 106 are reversed, i.e., the gate of transistor MP2 is connected to the output of NAND gate NA5, and the gate of transistor MN2 is connected to the output of inverter G20; the previously floating label N34 now marks the output of NAND gate NA5, and the previously floating label N22 now marks the gate of transistor MN2; and the node between inverters G1 and G2 in block 101 is marked with -- N2 --.

UNITED STATES PATENT AND TRADEMARK OFFICE
CERTIFICATE OF CORRECTION

PATENT NO. : 5,781,500
DATED : July 14, 1998
INVENTOR(S) : Jong Hoon Oh

It is certified that error appears in the above-identified patent and that said Letters Patent is hereby corrected as shown below:

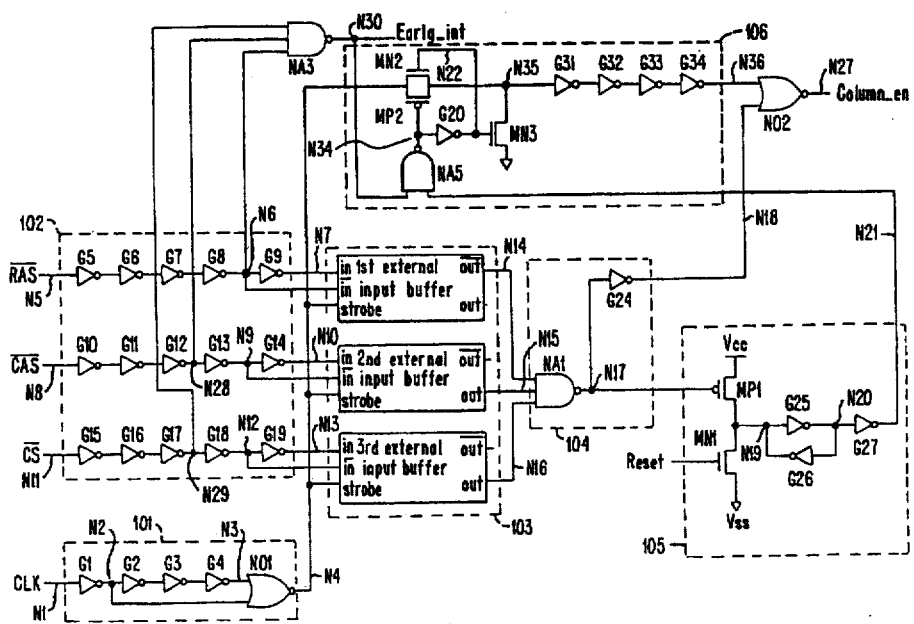

Fig. 6.

Signed and Sealed this

Twenty-fifth Day of December, 2001

Attest:

JAMES E. ROGAN
Attesting Officer    Director of the United States Patent and Trademark Office

UNITED STATES PATENT AND TRADEMARK OFFICE
CERTIFICATE OF CORRECTION

PATENT NO.   : 5,781,500
DATED        : July 14, 1998
INVENTOR(S)  : Jong Hoon Oh It is certified that error appears in the above-identified patent and that said Letters Patent is hereby corrected as shown below:

The title page, should be deleted to appear as per attached title page.

United States Patent [19]
Oh

[11] Patent Number: 5,781,500
[45] Date of Patent: Jul. 14, 1998

[54] METHOD AND CIRCUIT FOR GENERATING INTERNAL PULSE SIGNALS IN SYNCHRONOUS MEMORY

[75] Inventor: Jong Hoon Oh, Kyoungki-do, Rep. of Korea

[73] Assignee: Hyundai Electronics Industries Co., Ltd., Kyoungki-do, Rep. of Korea

[21] Appl. No.: 850,247
[22] Filed: May 2, 1997
[30] Foreign Application Priority Data May 6, 1996 [KR] Rep. of Korea ............... 199614688

[51] Int. Cl.$^6$ ........................................ G11C 8/00
[52] U.S. Cl. ............................... 365/233; 365/194
[58] Field of Search .......................... 365/233, 194, 365/193, 236

[56] References Cited

U.S. PATENT DOCUMENTS

| | | | |
|---|---|---|---|
| 4,984,216 | 1/1991 | Toda et al. | 365/230.08 |
| 5,392,239 | 2/1995 | Margulis et al. | 365/233 |
| 5,568,445 | 10/1996 | Park et al. | 365/233 |
| 5,598,376 | 1/1997 | Merritt et al. | 365/233 |
| 5,610,864 | 3/1997 | Manning | 365/193 |
| 5,610,874 | 3/1997 | Park et al. | 365/236 |
| 5,652,724 | 7/1997 | Manning | 365/189.05 |
| 5,673,233 | 9/1997 | Wright et al. | 365/233 |

*Primary Examiner*—Son T. Dinh
*Attorney, Agent, or Firm*—Merchant Gould Smith Edell Welter and Schmidt

[57] ABSTRACT

A method and a circuit for generating internal pulse signals in a synchronous memory is provided. A first pulse signal is generated in response to a burst mode command to transfer an external column address to an internal column address line. After the generation of the first pulse signal, a second pulse signal is generated to transfer an internal column address from an internal column address counter to the internal column address line in each clock cycle until the burst mode operation is advanced by a predetermined burst length. When a burst interrupt is generated in burst mode operation to perform the burst mode operation in response to a new external column address, the first pulse signal is generated and the generation of the second pulse signal is suppressed.

5 Claims, 8 Drawing Sheets

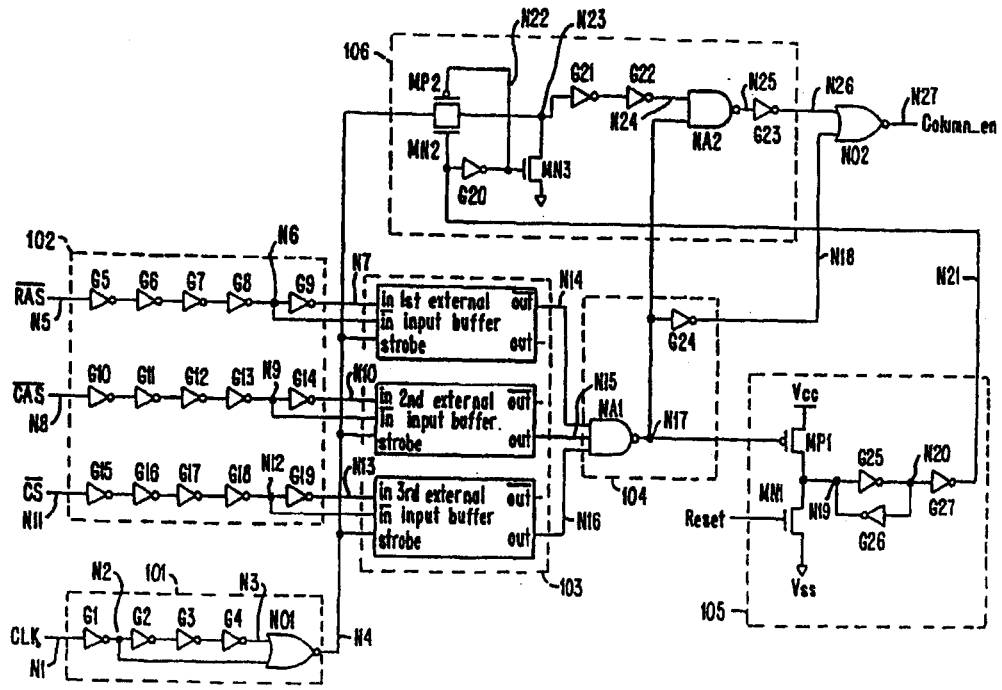

UNITED STATES PATENT AND TRADEMARK OFFICE
CERTIFICATE OF CORRECTION

PATENT NO.   : 5,781,500                                    Page 3 of 7
DATED        : July 14, 1998
INVENTOR(S)  : Jong Hoon Oh It is certified that error appears in the above-identified patent and that said Letters Patent is hereby corrected as shown below:

Drawings,
Sheet 1, Fig. 1(a), "T0" to the right of "T2" is changed to -- T3 --.

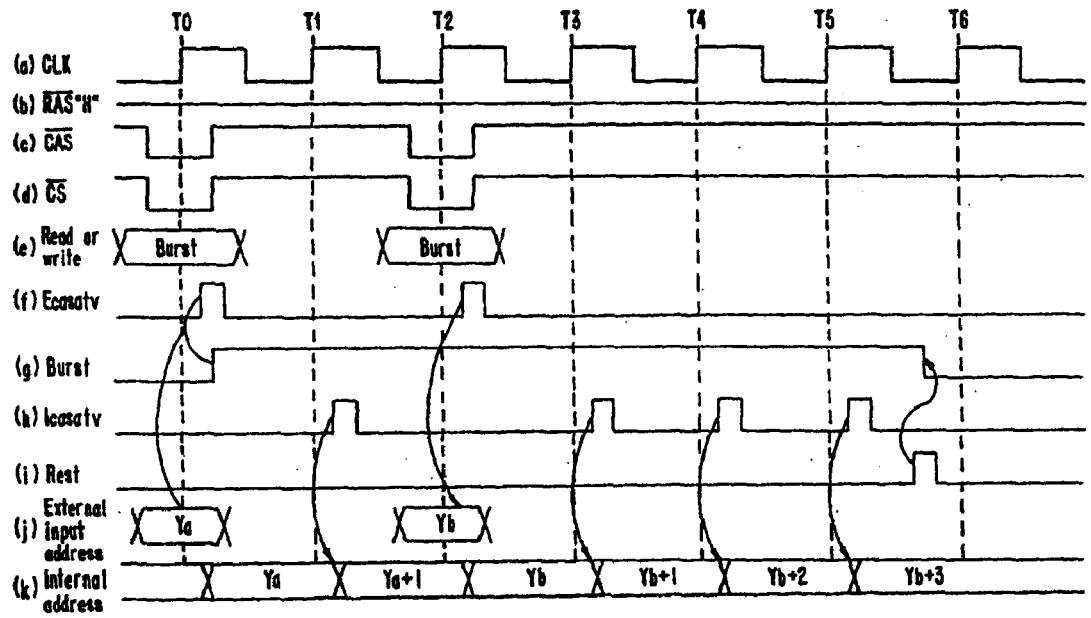

Fig. 1.

UNITED STATES PATENT AND TRADEMARK OFFICE
CERTIFICATE OF CORRECTION

PATENT NO.    : 5,781,500
DATED         : July 14, 1998
INVENTOR(S)   : Jong Hoon Oh It is certified that error appears in the above-identified patent and that said Letters Patent is hereby corrected as shown below:

Sheet 2,
Fig. 2, the node number at the output node of the edge signal generator 101 is changed from "N16" to -- N4 --; an input terminal of NAND gate NA1 previously connected to the "out" terminal of the 3rd External Input Buffer in block 103 is now connected to the "out" terminal of the 3rd External Input Buffer, and is labeled as node -- N16 --;
a bubble indicating an electrical connection between the input of inverter G20, gate of transistor MN2, and output of flip flop block 105 is added; and the node between inverters G1 and G2 in block 101 is marked with -- N2 --.

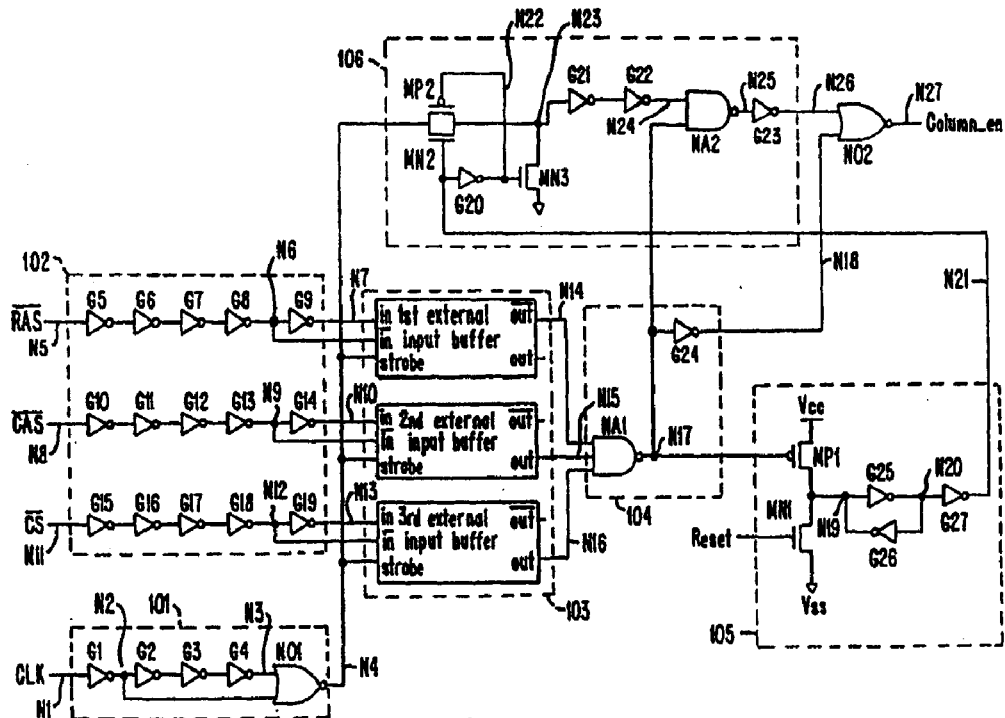

Fig. 2.

UNITED STATES PATENT AND TRADEMARK OFFICE
CERTIFICATE OF CORRECTION

PATENT NO. : 5,781,500
DATED : July 14, 1998
INVENTOR(S) : Jong Hoon Oh

It is certified that error appears in the above-identified patent and that said Letters Patent is hereby corrected as shown below:

Sheet 4,
Fig. 4, the node number at the output node of the edge signal generator 101 is changed from "N16" to -- N4 --; an input terminal of NAND gate NA1 previously connected to the "out" terminal of the 3rd External Input Buffer in block 103 is now connected to the "out" terminal of the 3rd External Input Buffer, and is labeled as node -- N16 --; a bubble indicating an electrical connection between the input of inverter G20, gate of transistor MN2, output of flip flop block 105 is added; the previously floating label N22 now marks the gate of transistor MP2; the bubble between inverters G11 and G12 in the delay circuit 102 is removed to eliminate the electrical connection between this node and node N29 and input of NAND gate NA3; and the node between inverters G1 and G2 in block 101 is marked with -- N2 --.

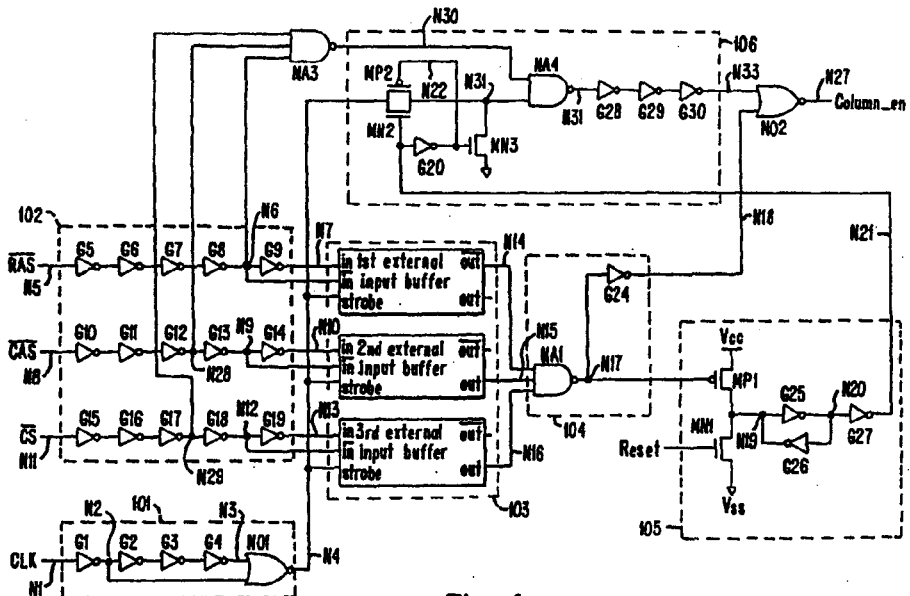

Fig. 4.

UNITED STATES PATENT AND TRADEMARK OFFICE
CERTIFICATE OF CORRECTION

PATENT NO.   : 5,781,500
DATED        : July 14, 1998
INVENTOR(S)  : Jong Hoon Oh It is certified that error appears in the above-identified patent and that said Letters Patent is hereby corrected as shown below:

Sheet 6,
Fig. 6, the node number at the output node of the edge signal generator 101 is changed from "N16" to -- N4 --; an input terminal NAND gate NA1 previously connected to the "out" terminal of the 3rd External Input Buffer in block 103 is now connected to the "out" terminal of the 3rd External Input Buffer, and is labeled as node -- N16 --; the bubble between inverters G11 and G12 in the delay circuit 102 is removed to eliminate he electrical connection between this node and node N29 and input of NAND gate NA3; a bubble indicating an electrical connection between the input of inverter G20, the output of NAND gate NA5, and the gate of transistor MP2 is added; a bubble indicating an electrical connection between the output of NAND gate NA3 and an input of NAND gate NA5 is added; the gate connections of transistors MP2 and MN2 in block 106 are reversed, i.e., the gate of transistor MP2 is connected to the output of NAND gate NA5, and the gate of transistor MN2 is connected to the output of inverter G20; the previously floating label N34 now marks the output of NAND gate NA5, and the previously floating label N22 now marks the gate of transistors MN2; and the node between inverters G1 and G2 in block 101 is marked with -- N2 --.

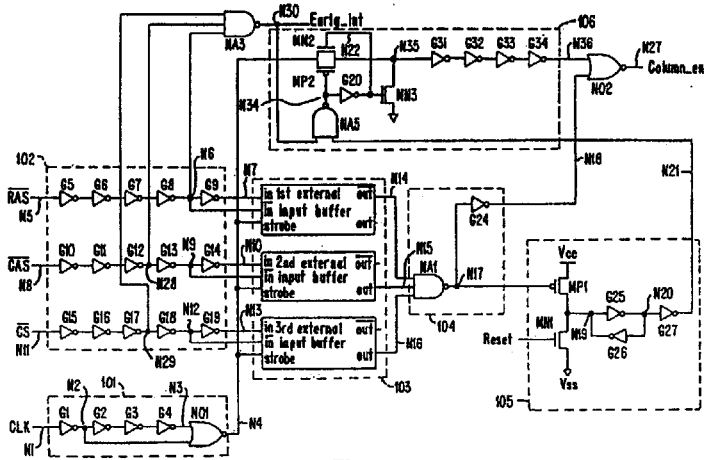

Fig. 6.

UNITED STATES PATENT AND TRADEMARK OFFICE
CERTIFICATE OF CORRECTION

PATENT NO. : 5,781,500
DATED : July 14, 1998
INVENTOR(S) : Jong Hoon Oh

It is certified that error appears in the above-identified patent and that said Letters Patent is hereby corrected as shown below:

Column 9,
Lines 40-41, replace "the twenty-second node N22" with -- the thirty-fourth node N34 --

This certificate supersedes Certificate of Correction issued on December 25, 2001.

Signed and Sealed this

First Day of October, 2002

Attest:

Attesting Officer

JAMES E. ROGAN
Director of the United States Patent and Trademark Office